(12) United States Patent
Kumano

(10) Patent No.: US 11,539,188 B2
(45) Date of Patent: Dec. 27, 2022

(54) SURFACE EMITTING LASER AND METHOD OF MANUFACTURING THE SAME

(71) Applicant: SUMITOMO ELECTRIC INDUSTRIES, LTD., Osaka (JP)

(72) Inventor: Tetsuya Kumano, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 266 days.

(21) Appl. No.: 16/915,235

(22) Filed: Jun. 29, 2020

(65) Prior Publication Data

US 2021/0028600 A1 Jan. 28, 2021

(30) Foreign Application Priority Data

Jul. 25, 2019 (JP) .............................. JP2019-136972

(51) Int. Cl.
*H01S 5/042* (2006.01)
*H01S 5/183* (2006.01)

(52) U.S. Cl.
CPC ...... *H01S 5/18347* (2013.01); *H01S 5/04257* (2019.08); *H01S 5/1833* (2013.01); *H01S 5/18313* (2013.01); *H01S 5/18325* (2013.01); *H01S 5/18327* (2013.01)

(58) Field of Classification Search
CPC ............... H01S 5/0425; H01S 5/04254; H01S 5/04256; H01S 5/04257; H01S 5/12; H01S 5/18; H01S 5/183; H01S 5/18308; H01S 5/18311; H01S 5/18313; H01S 5/18322; H01S 5/18325; H01S 5/18327; H01S 5/1833; H01S 5/18344; H01S 5/18347

See application file for complete search history.

(56) References Cited

U.S. PATENT DOCUMENTS

| | | | | |
|---|---|---|---|---|
| 6,483,860 B1* | 11/2002 | Ueki | ................... | H01S 5/18355 372/45.01 |
| 2003/0063649 A1 | 4/2003 | Ezaki et al. | | |
| 2003/0231682 A1* | 12/2003 | Eitel | ................... | H01S 5/18341 372/45.01 |

(Continued)

FOREIGN PATENT DOCUMENTS

| | | |
|---|---|---|
| JP | 2003-110196 A | 4/2003 |
| JP | 2005-044964 A | 2/2005 |

(Continued)

*Primary Examiner* — Matthew Luu
*Assistant Examiner* — Kendrick X Liu
(74) *Attorney, Agent, or Firm* — Oliff PLC

(57) ABSTRACT

A surface emitting laser includes a lower reflector layer, an active layer, an upper reflector layer, and a wiring. The lower reflector layer, the active layer, and the upper reflector layer form a mesa, a terrace, and a connecting portion. A first groove is provided between the mesa and the terrace. The connecting portion connects the mesa and the terrace, and extends in a direction inclined from <011> direction of the substrate. A high-resistance region is formed in the terrace, in the connecting portion, and in a peripheral portion of the mesa. The wiring is provided on top surfaces of the terrace, the connecting portion, and the mesa. The mesa includes an oxide region extending from a side surface of the mesa and a current confinement structure including an aperture surrounded by the oxide region.

6 Claims, 4 Drawing Sheets

(56) References Cited

U.S. PATENT DOCUMENTS

2009/0295902 A1\* 12/2009 Sato ............... B82Y 20/00
372/24
2010/0226402 A1\* 9/2010 Maeda ............ B82Y 20/00
372/45.01

FOREIGN PATENT DOCUMENTS

JP 2005045107 A \* 2/2005
WO 2015/033649 A1 3/2015

\* cited by examiner

SURFACE EMITTING LASER AND METHOD OF MANUFACTURING THE SAME

CROSS-REFERENCE TO RELATED APPLICATION

This application is based upon and claims the benefit of priority of the prior Japanese Patent Application No. 2019-136972, filed on Jul. 25, 2019, the entire contents of which are incorporated herein by reference.

FIELD

The present invention relates to a surface emitting laser and a method of manufacturing the same.

BACKGROUND

PCT Publication No. WO 2015/033649 (Patent Document 1) discloses a vertical cavity surface-emitting laser (VCSEL).

A vertical cavity surface-emitting laser (VCSEL, may be described simply as a surface emitting laser) has two reflector layers and an active layer sandwiched between the reflector layers. A mesa is formed from an active layer, a reflector layer, or the like, and a portion of the reflector layer of the mesa is selectively oxidized to form an oxide region and an aperture surrounded by the oxide region.

SUMMARY

The mesa of the surface emitting laser is surrounded by a groove. The groove is formed by etching a stacked semiconductor layers. Some layers in the stacked semiconductor layers are electrically conductive. A wiring is provided from the mesa across the groove by arranging the wiring on a surface of the groove. However, when the distance between the wiring and the conductive semiconductor layers is reduced, a parasitic capacitance is increased. In order to avoid the increase of the parasitic capacitance, the wiring may be arranged on a surface of an unetched portion where the stacked semiconductor layers is left without being etched. Then the distance between the wiring and the conductive semiconductor layers, and the parasitic capacitance is reduced.

However, a presence of the unetched portion connected to the mesa makes it difficult for the reflector layer to be oxidized from that direction, thereby a shape of the aperture is deformed. It is therefore an object of the present disclosure to provide a surface emitting laser having an aperture of a desired shape and capable of reducing the parasitic capacitance, and a method of manufacturing the same.

A surface emitting laser according to the present disclosure includes a substrate, a lower reflector layer provided on the substrate, an active layer provided on the lower reflector layer, an upper reflector layer provided on the active layer, and a wiring. The lower reflector layer, the active layer, and the upper reflector layer form a mesa, a terrace, and a connecting portion. A first groove is provided between the mesa and the terrace. The connecting portion extends along a direction inclined from the <011> direction of the substrate. The connecting portion connects the mesa and the terrace. A high resistance region is formed in a peripheral portion of the mesa, in the terrace, and in the connecting portion. The wiring is provided on top surfaces of the terrace, the connecting portion, and the mesa. The mesa includes an oxide region extending from the peripheral portion of the mesa and a current confinement layer including an aperture surrounded by the oxide region.

A method of manufacturing a surface-emitting laser according to the present embodiment includes the steps of: forming a lower reflector layer, an active layer, and an upper reflector layer on a substrate in order; forming a high resistance region by implanting ions into a portion of each of the lower reflector layer, the active layer, and the upper reflector layer; forming a mesa, a terrace, and a connecting portion from the lower reflector layer, the active layer, and the upper reflector layer; forming a current confinement structure in the mesa; forming a wiring on a top surface of each of the terrace, the connecting portion, and the mesa. The terrace and the connecting portion include the high resistance region. A first groove is provided between the mesa and the terrace. The connecting portion is inclined from <011> direction of the substrate. The step of forming the current confinement structure includes a step of oxidizing a part of the upper reflector layer from a side surface of the mesa so as to form an aperture surrounded by an oxide region overlapping with the active layer.

DESCRIPTION OF EMBODIMENTS

Figure 1:
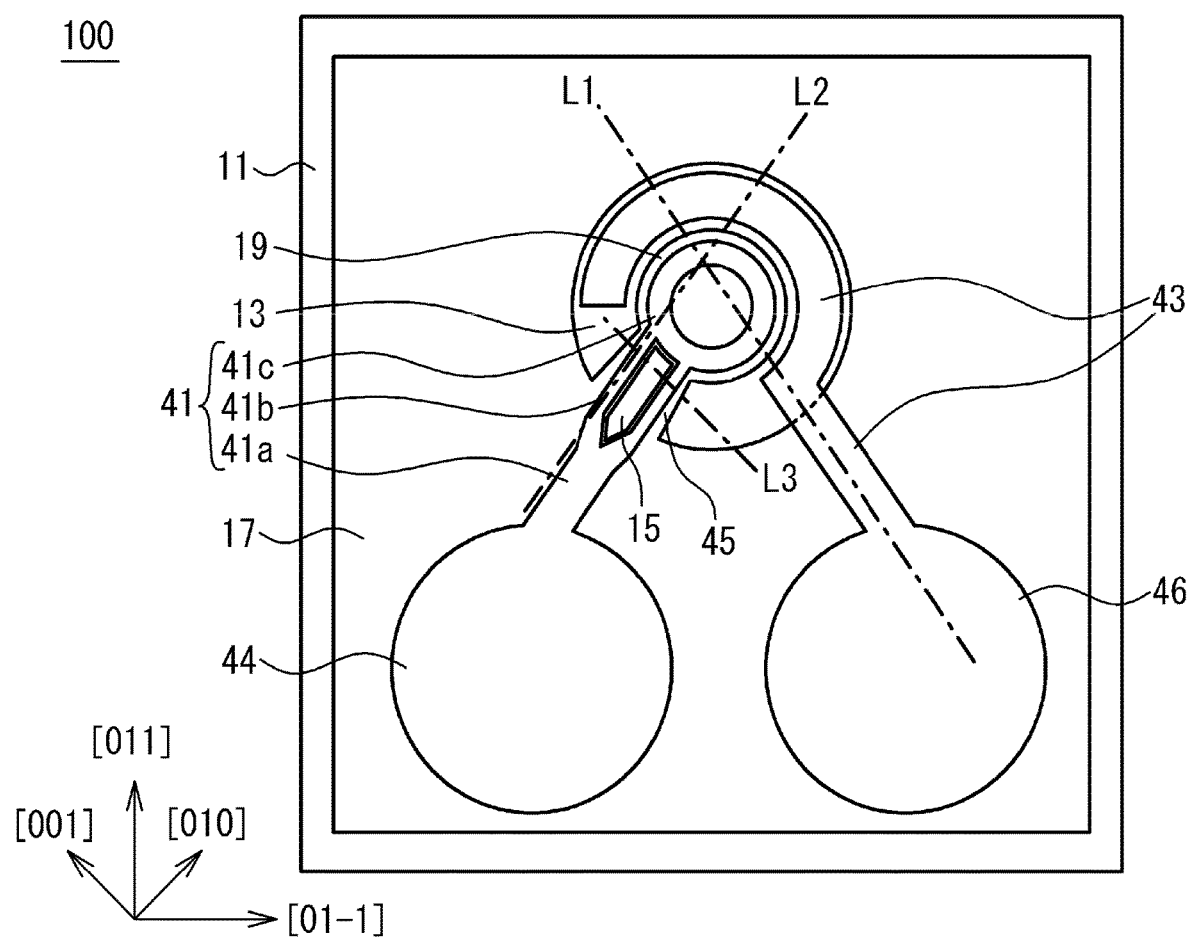
FIG. 1 is a plan view illustrating a surface emitting laser according to an embodiment.

Some embodiments will now be described. (1) An embodiment of the present disclosure is a surface emitting laser including a substrate, a lower reflector layer provided on the substrate, an active layer provided on the lower reflector layer, an upper reflector layer provided on the active layer, and a wiring. The lower reflector layer, the active layer, and the upper reflector layer form a mesa, a terrace, and a connecting portion. A first groove is provided between the mesa and the terrace. The connecting portion extends in a direction inclined from <011> direction of the substrate. The connecting portion connects the mesa and the terrace. A high resistance region is formed in a peripheral portion of the mesa, in the terrace, and in the connecting portion. The wiring is provided on top surfaces of the terrace, the connecting portion, and the mesa. The mesa includes an oxide region extending from the peripheral portion of the mesa and a current confinement structure including an aperture surrounded by the oxide region. Since the wiring extends on the connecting portion, a parasitic capacitance can be reduced. Further, by the connecting portion being extended in the direction inclined from the <011> direction, it is possible to control an oxidation of the upper reflector layer to form an aperture of a desired shape.

(2) The connecting portion may have an inclination angle from the <011> direction of the substrate in a range of 35° or more and 55° or less. Thus, the oxidation of the upper reflector layer can be controlled to form the aperture having the desired shape.

(3) The surface emitting laser may further include a plurality of the connecting portion connected between the mesa and the terrace and a second groove between the plurality of connecting portions. The wiring may be provided on each top surface of the plurality of connecting portions. By increasing a sum of widths of the plurality of wirings, it is possible to suppress heat generation from the wiring when a current flows in the wirings.

(4) The width of each of the plurality of wirings may be 5 μm or more. It is possible to suppress heat generation by increasing the width of the wiring.

(5) The width of the second groove may be 3 μm or more and 20 μm or less. Thus, the connecting portion can be positioned away from the <011> direction and be connected to the mesa nearly at the <001> direction. As a result, the oxidation of the upper reflector layer can be controlled to form the aperture having the desired shape.

(6) The substrate may be formed of gallium arsenide. The lower reflector layer and the upper reflector layer may be formed of aluminum gallium arsenide, and the current confinement structure may include aluminum oxide. An oxidation speed of aluminum gallium arsenide depends on a plane orientation of aluminum gallium arsenide. The oxidation speed is slow in the <011> direction, and fast in the <001> direction. By arranging the connecting portion away from the <011> direction, it is possible to form the aperture of the desired shape.

(7) An embodiment of the present disclosure for manufacturing a surface emitting laser includes steps of: forming a lower reflector layer, an active layer, and an upper reflector layer on a substrate in order; forming a high resistance region by implanting ions into a portion of each of the lower reflector layer, the active layer, and the upper reflector layer; forming a mesa, a terrace, and a connecting portion from the lower reflector layer, the active layer, and the upper reflector layer; forming a current confinement structure in the mesa; and forming a wiring on a top surface of each of the terrace, the connecting portion, and the mesa. The terrace and the connecting portion include the high resistance region. A first groove is provided between the mesa and the terrace. The connecting portion extends in a direction inclined from <011> direction of the substrate. The connecting portion connects the mesa and the terrace. The step of forming the current confinement structure includes a step of oxidizing a part of the upper reflector layer from a side surface of the mesa so as to form an aperture surrounded by an oxide region. When the wiring is provided over the connecting portion where the high resistance region is formed, parasitic capacitance can be reduced. Further, by the connecting portion is inclined from the <011> direction, it is possible to control an oxidation speed of the upper reflector layer and to form an aperture of a desired shape.

Specific examples of a surface emitting laser and a manufacturing method thereof according to the present disclosure will be described below with reference to the drawings. It should be noted that the present disclosure is not limited to these examples, but is indicated by the claims, and it is intended to include all modifications within the meaning and range equivalent to the claims. First Embodiment (surface emitting laser) FIG. 1 is a plan view illustrating a surface emitting laser 100 according to a first embodiment. A length of one side of the surface emitting laser 100 illustrated in FIG. 1 is 300 μm, for example. A trench 11 for an element isolation is provided in an outer peripheral portion of the surface emitting laser 100. In an area surrounded by the trenches 11, a mesa 19, a terrace 17, a connecting portion 45, wirings 41 and 43, pads 44 and 46 are arranged.

The mesa 19 and a groove 13 are, for example, circular. The groove 13 is provided around the mesa 19. The terrace 17 surrounds the groove 13 and the mesa 19. The connecting portion 45 is a bifurcated bridge connecting the terrace 17 and the mesa 19. A groove 15 is provided inside of the connecting portion 45.

The wiring 41 extends from the pad 44 to the mesa 19. The wiring 41 is provided on a top surface of the terrace 17, on a top surface of the connecting portion 45, and on a top surface of the mesa 19. The wiring 41 is not provided in the grooves 13 and 15. A portion of the wiring 41 on the terrace 17 may be described as a wiring 41a, a portion of the wiring 41 on the connecting portion 45 may be described as a wiring 41b, and a portion of the wiring 41 on the mesa 19 may be described as a wiring 41c. Two wirings of the wiring 41b are branched from the wiring 41a, are disposed on the two connecting portions 45, merge into the wiring 41c. The wiring 43 extends from the pad 46 and is provided from the top surface of the terrace 17 to an inside of the groove 13. A direction of the connecting portion 45 will be described later.

Figure 2A:
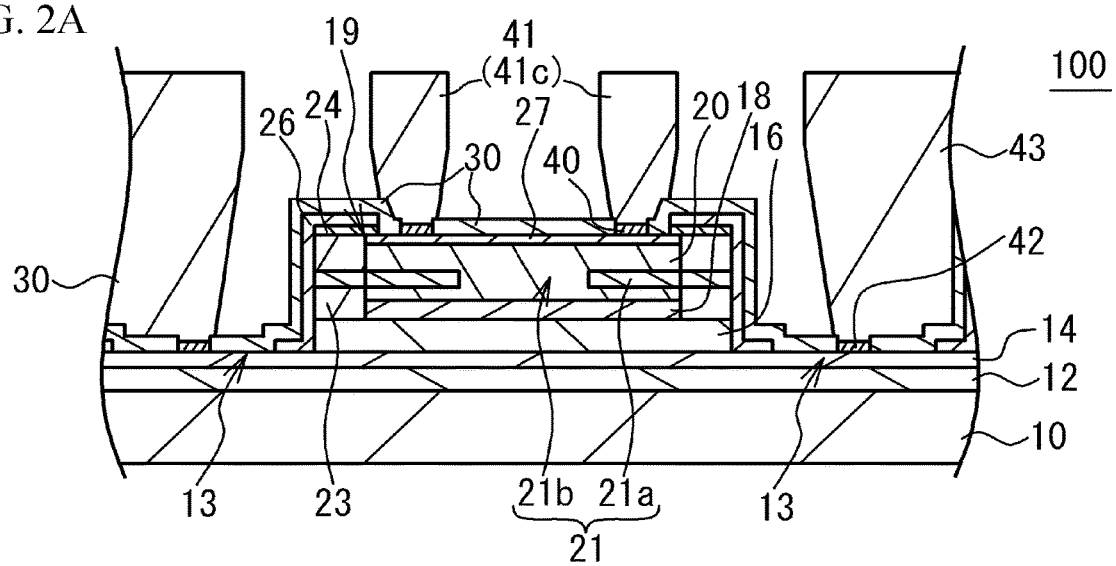
FIG. 2A is a cross-sectional view illustrating a surface emitting laser.
Figure 2B:
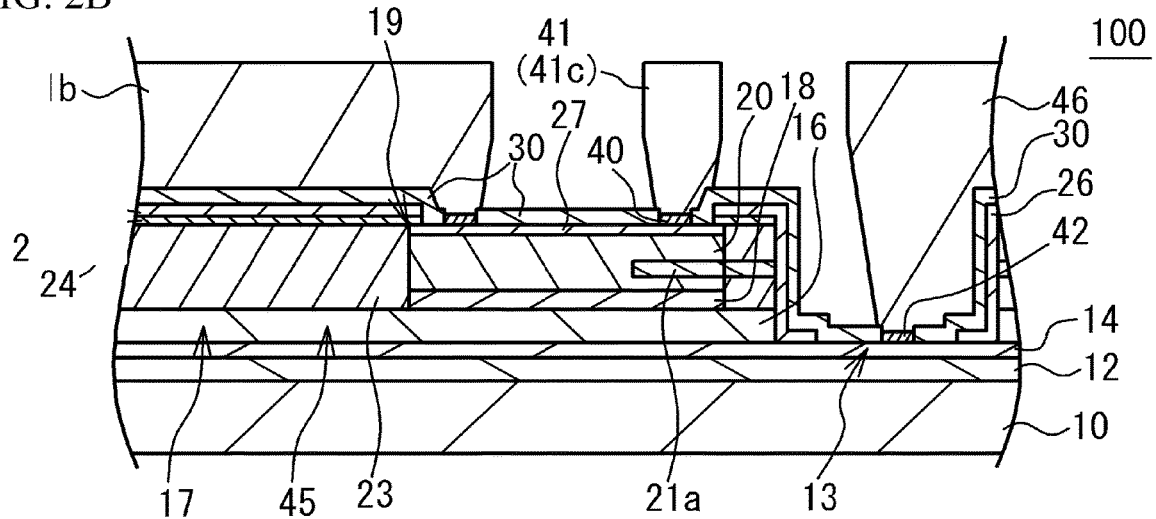
FIG. 2B is a cross-sectional view illustrating a surface emitting laser.
Figure 2C:
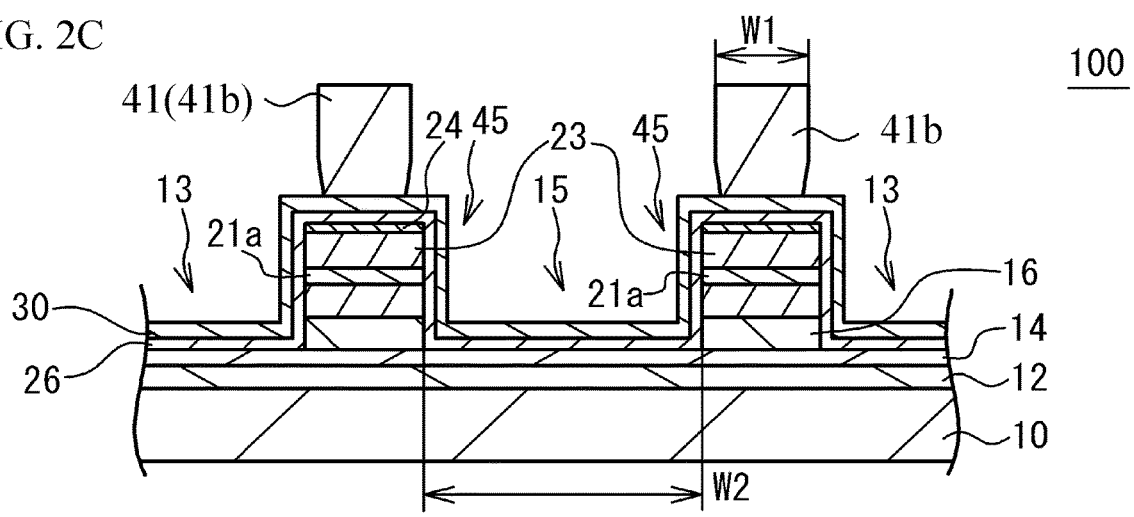
FIG. 2C is a cross-sectional view illustrating a surface emitting laser.

FIG. 2A, FIG. 2B, and FIG. 2C are cross-sectional views illustrating the surface emitting laser 100. FIG. 2A illustrates a cross-sectional view taken along a line L1 of FIG. 1. FIG. 2B illustrates a cross-sectional view taken along a line L2 of FIG. 1. FIG. 2C illustrates a cross-sectional view taken along a line L3 of FIG. 1.

As illustrated in FIG. 2A and FIG. 2B, the surface emitting laser 100 is a VCSEL including a substrate 10, DBR (Distributed Bragg Reflector) layers 12, 16, and 20, contact layers 14 and 27, and an active layer 18.

The substrate 10 is a semiconductor substrate formed of, for example, semi-insulating gallium arsenide (GaAs). The DBR layer 12, the contact layer 14, the DBR layer 16 (lower reflector layer), the active layer 18, the DBR layer 20 (upper reflector layer), and the contact layer 27 are stacked in this order on a (100) plane of the substrate 10. Top surfaces of these layers are parallel to a top surface of the substrate 10. Buffer layers of GaAs and AlGaAs may be provided between the substrate 10 and the DBR layer 12.

The DBR layers 12, 16, and 20 are, for example, semiconductor multilayers which include alternately stacked $Al_xGa_{1-x}As$ (x=0.16) and $Al_yGa_{1-y}As$ (y=0.9) each having an optical film thickness of λ/4. The DBR layer 12 is an i-type semiconductor and is not intentionally doped. The DBR layer 16 is an n-type semiconductor doped with silicon (Si) with a concentration between $5\times10^{17}$ cm$^{-3}$ and $3\times10^{18}$ cm$^{-3}$. The DBR layer 20 is a p-type semiconductor doped with zinc (Zn) with a concentration between $1\times10^{18}$ cm$^{-3}$ and $1\times10^{19}$ cm$^{-3}$.

The contact layer 14 is formed by n-type $Al_xGa_{1-x}As$ (x=0.1) whose thickness is 400 nm, for example. The contact layer 14 is doped with Si with a concentration of $3\times10^{18}$ cm$^{-3}$. The contact layer 27 is formed by a p-type $Al_xGa_{1-x}As$ (x=0.16) whose thickness is 100 nm, for example, and doped with Zn with a concentration of $1\times10^{19}$ cm$^{-3}$.

The active layer 18 includes a multiple-quantum well (MQW) structure in which $In_yGa_{1-y}As$ layer (y=0.107) and $Al_xGa_{1-x}As$ layer (x=0.3) are stacked alternately, and has optical gains. The substrate 10, the DBR layer 12, the contact layer 14, the DBR layer 16, the active layer 18, the DBR layer 20, and the contact layer 27 may be formed of a compound semiconductor other than the above.

The DBR layer 16, the active layer 18, the DBR layer 20, and the contact layer 27 form the mesa 19. A height of the mesa 19 is, for example, 4.5 μm or more and 5.0 μm or less, and a width of its top surface is, for example, 30 μm. A side surface of the mesa 19 may extend in a direction perpendicular to the top surface of the substrate 10, or inclined with respect to a stacking direction of the layers. The groove 13 is located around of the mesa 19, and a width of the groove 13 is, for example, 20 μm.

As illustrated in FIG. 2A, a high-resistance region 23 is formed on a peripheral portion of the mesa 19. As illustrated in FIG. 2B, the connecting portion 45 and the terrace 17 include the high-resistance regions 23 that are continuous from the mesa 19. As illustrated in FIG. 2C, each of the two connecting portions 45 includes the high-resistance region 23.

The DBR layer 20 includes a current confinement structure 21, and the current confinement structure 21 includes an oxide region 21a and an aperture 21b. The oxide region 21a is formed by oxidizing a part of the plurality of layers included in the DBR layer 20. The oxide region 21a extends from a peripheral portion of the DBR layer 20 and is not formed in a center portion of the DBR layer 20. The aperture 21b is an unoxidized portion surrounded by the oxide region 21a. The aperture 21b overlaps with the active layer 18. A diameter of the aperture 21b is, for example, 7.5 μm. The oxide region 21a includes, for example, aluminum oxide ($Al_2O_3$). The oxide region 21a is insulative, and an electrical current is harder to flow in the oxide region 21a than in a non-oxidized portion. On the other hand, in the aperture 21b, the electrical current is easier to flow than in the oxide region 21a. The aperture 21b serves as a current path. The current confinement structure 21 enables efficient current injection.

An insulating film 24 is formed of, for example, silicon nitride (SiN), and is provided on the high-resistance region 23. An insulating film 26 is formed of SiN, for example. The insulating film 26 covers a surface of the contact layer 14, the side surface of the mesa 19, and a surface of the insulating film 24. An insulating film 30 is formed of, for example, SiN, covering the insulating film 26 and the mesa 19.

Electrodes 40 and 42 are arranged in an opening of the insulating film 30. The electrode 40 is provided on the top surface of the mesa 19 and connected to a surface of the contact layer 27. The electrode 42 is provided on a bottom of the groove 13, and connected to the contact layer 14. The insulating film 30 covers the electrodes 40 and 42, and the wirings 41 and 43 are provided on the insulating film 30. The wiring 41c is located above the mesa 19 and is electrically connected to the electrode 40. The wiring 43 is located inside the groove 13 and is electrically connected to the electrode 42.

As illustrated in FIG. 2C, the wiring 41b is provided on each of the two connecting portions 45. Between the two connecting portions 45, the groove 15 (second groove) is provided. The groove 15 separates the two connecting portions 45. On both sides of the two connecting portions 45, the groove 13 is located. A width W1 of one of the wiring 41b is, for example, 5 μm or more. A width W2 at a bottom of the groove 15 is, for example, 3 μm or more and 20 μm or less.

The electrode 40 is formed of a metal such as a stack of titanium (Ti), platinum (Pt), and gold (Au), for example. The electrode 42 is formed of a metal such as a laminate of gold, germanium (Ge), and nickel (Ni), for example. The wirings 41 and 43, the pads 44 and 46 illustrated in FIG. 1 are formed of a metal such as Au.

FIG. 1 shows the substrate 10 and the (100) plane of a compound semiconductor as a plan view. In FIG. 1, a vertical direction is a [011] direction of the substrate 10, and a lateral direction is a [01-1] direction. The connecting portion 45 and the wiring 41 extend in a direction inclined from a <011> direction which includes the direction and the [01-1] direction. An inclination angle between the <011> direction and the direction along which the connecting portion 45 extends is, for example, 35° or more and 55° or less. The inclination angle is preferably 45°, and the connecting portion 45 and the wiring 41 may extend along a [001] direction.

As described later, a part of the DBR layer 20 is oxidized to form the current confinement structure 21. An oxidation speed of the DBR layer 20 depends on a plane orientation. The oxidation speed is slow when the oxidation starts from a side surface perpendicular to the <011> direction and progress inside the mesa 19. The oxidation speed is fast when the oxidation starts from a side surface perpendicular to the <001> direction which includes the [001] direction and a [00-1] direction toward inside. By making the connecting portion 45 inclined from the <011> direction, the oxidation speed is adjusted to obtain the preferable shape (for example, circular) of the aperture 21b.

Bonding wires (not illustrated) are bonded to the pads 44 and 46, and a current injection into the surface emitting laser 100 is performed. The current injection causes the active layer 18 to emit light, and the DBR layer functions as a resonator. For example, a laser beam having a wavelength of 900 nm is emitted toward the upper side from the aperture 21b. By changing an injection amount of the current periodically, it is possible to emit a modulated laser beam. If the parasitic capacitance of the surface emitting laser 100 is large, operation at high frequencies becomes difficult. As illustrated in FIG. 1 and FIG. 2C, the wiring 41 is provided on the connecting portion 45, and the distance between the wiring 41 and the conductive semiconductor layers (the active layer 18, the DBR layers 16 and 20) increases. Therefore the parasitic capacitance is reduced, and the characteristics of the surface emitting laser 100 at high frequencies is good.

(Manufacturing Method) FIG. 3A to FIG. 4C are cross-sectional views illustrating the manufacturing methods of the surface emitting lasers 100. FIG. 3D illustrates a cross-section corresponding to the line L3 in FIG. 1. The other diagrams illustrate cross-sections corresponding to the line L1 in FIG. 1.

Figure 3A:
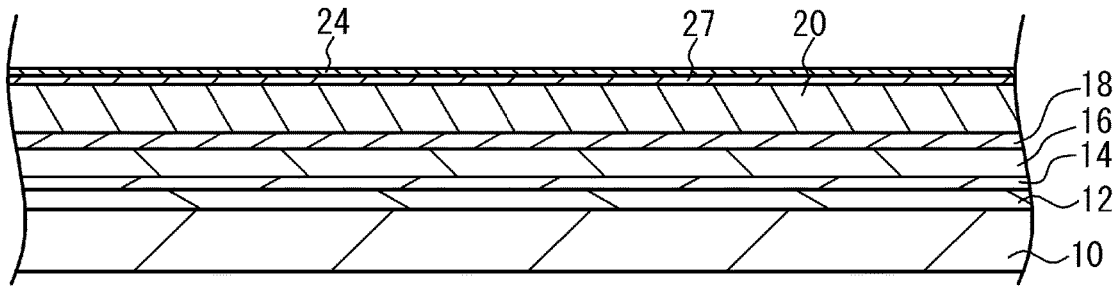
FIG. 3A is a cross-sectional view illustrating a method of manufacturing a surface emitting laser.

As illustrated in FIG. 3A, semiconductor layers for the DBR layer 12, the contact layer 14, the DBR layer 16, the active layer 18, the DBR layer 20, and the contact layer 27 are epitaxially grown in this order on the substrate 10 by a metal-organic vapor phase epitaxy (MOVPE) method or a molecular beam epitaxy (MBE) method. These layers are grown on the (100) plane of the substrate 10, and a major surface of each layer has, for example, the same orientation as a major surface of the substrate 10, i.e., (100) plane.

The DBR layer 20 includes an $Al_xGa_{1-x}As$ layer (0.95≤x≤1.0) for forming the oxide region 21a. The insulating film 24 is formed on the contact layer 27 by a plasma CVD method or the like. The DBR layer 20 and the contact layer 27 may be etched to form alignment marks (not illustrated).

Figure 3B:
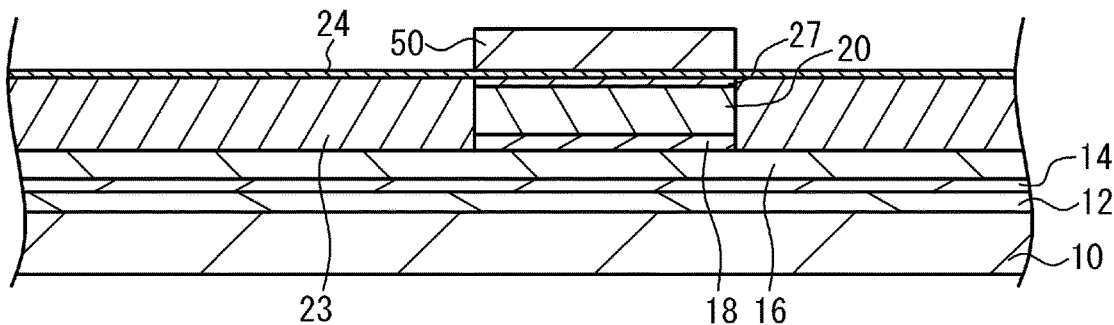
FIG. 3B is a cross-sectional view illustrating a method of manufacturing a surface emitting laser.

As illustrated in FIG. 3B, a mask 50 is formed on the insulating film 24, and ions such as protons (H+) are implanted to form the high-resistance regions 23. A depth of the ion implanted is, for example, 3 μm or less, or 4.5 μm or less. A portion covered with the mask 50 is not implanted with ions.

Figure 3C:
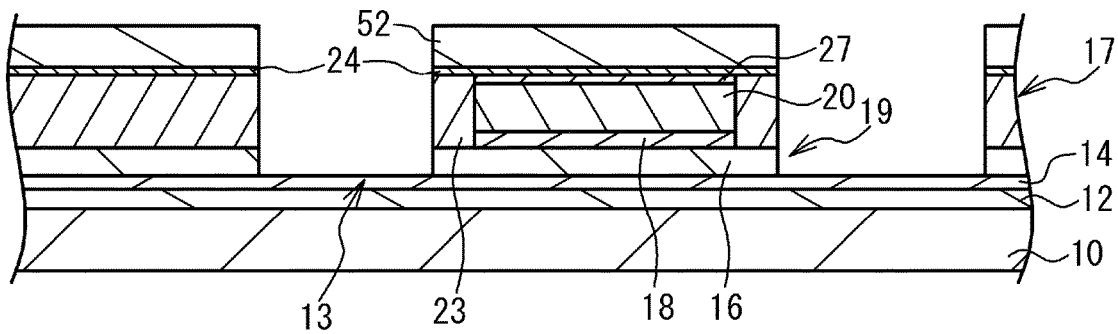
FIG. 3C is a cross-sectional view illustrating a method of manufacturing a surface emitting laser.
Figure 3D:
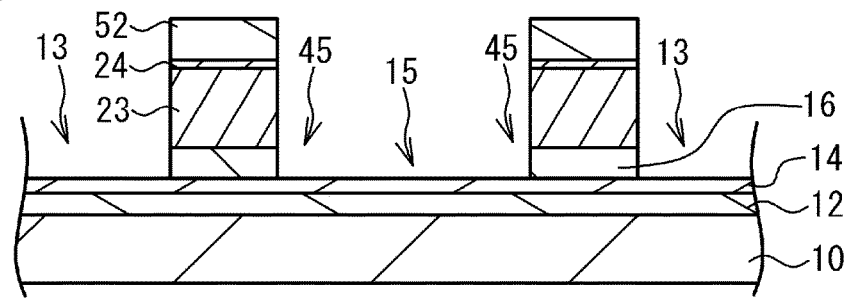
FIG. 3D is a cross-sectional view illustrating a method of manufacturing a surface emitting laser.

As illustrated in FIG. 3C and FIG. 3D, after the mask 50 is removed, a mask 52 is provided. The mask 52 is larger than the mask 50, and covers a portion of the high-resistance region 23 and a portion of a region into which no ions have been implanted. For example, using a inductively-coupled plasma reactive ion etching (ICP-RIE) device, dry etching is performed until the contact layer 14 is exposed, to form the groove 13 as illustrated in FIG. 3C, and to form the groove 15 as illustrated in FIG. 3D. This dry-etching forms the mesa 19 and the terrace 17 as illustrated in FIG. 3C. The dry-etching forms the connecting portion 45 as illustrated in FIG. 3D. As illustrated in FIG. 1, the mesa 19 is circular, and the groove 13 is formed between the mesa 19 and the terrace 17. The groove 15 is formed between the two connecting portions 45. The connecting portion 45 connects the mesa 19 and the terrace 17 and extends, for example, in the [010] direction.

Figure 4A:
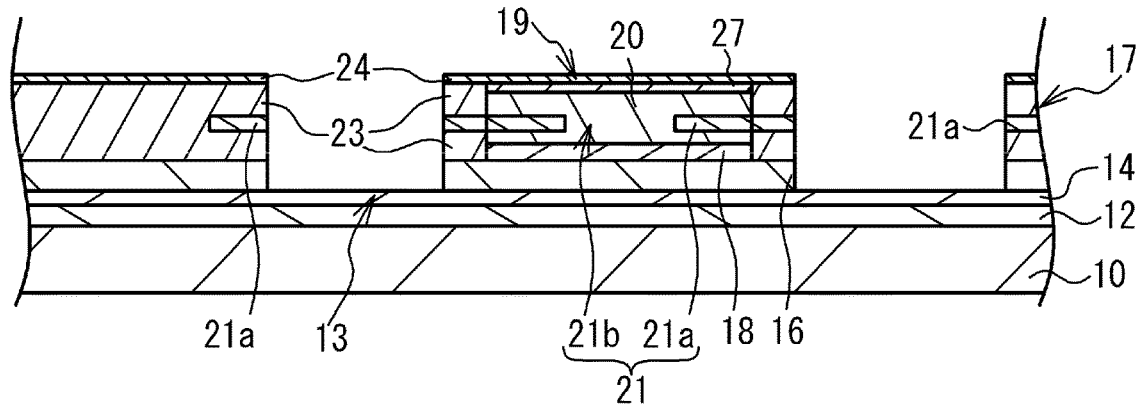
FIG. 4A is a cross-sectional view illustrating a method of manufacturing a surface emitting laser.

As illustrated in FIG. 4A, by being heated to about 420° C., in a water vapor atmosphere, the $Al_xGa_{1-x}As$ (0.95≤x≤1.0) layer included in the DBR layer 20 is oxidized from the side surfaces to form the oxide regions 21a. A heating time is determined so that the oxide regions 21a reach a predetermined width and an unoxidized portion, i.e., the aperture 21b, having a predetermined width remains between the oxide regions 21a.

There is a plane orientation dependence on the speed of oxidation of the DBR layer 20, and oxidation is slow in the [011] and [01-1] directions, and fast in the and [010] directions. Since the connecting portion 45 is connected to the mesa 19 from the [010] direction, oxidation of the DBR layer 20 in this direction is suppressed. As a result, oxidation evenly proceeds inward from the outer periphery of the mesa 19, and the aperture 21b having a circular shape similar to the mesa 19 is formed. In other words, a formation of protrusions in the aperture 21b is suppressed.

Figure 4B:
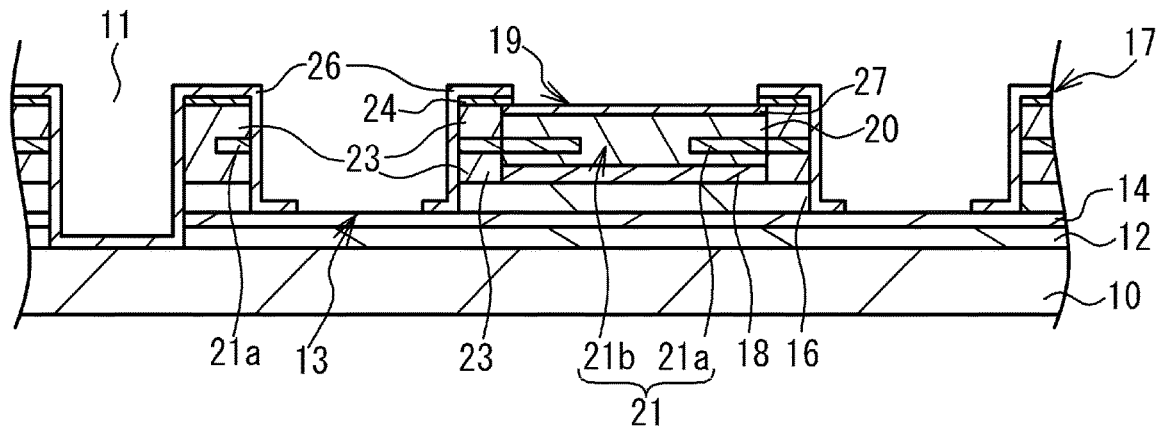
FIG. 4B is a cross-sectional view illustrating a method of manufacturing a surface emitting laser.

As illustrated in FIG. 4B, by dry-etching from the contact layer 27 to the DBR layer 12, the trench 11 for separating elements is formed. A depth of the trench 11 is 8 μm, for example. After the trench 11 is formed, the insulating film 26 is formed by, for example, a plasma CVD (chemical vapor deposition) method.

Figure 4C:
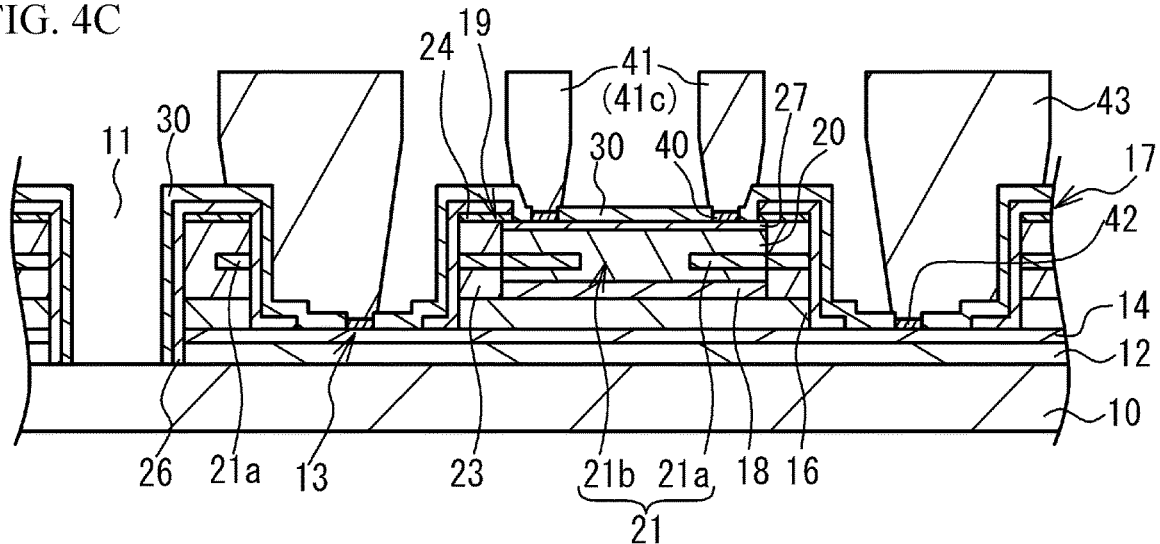
FIG. 4C is a cross-sectional view illustrating a method of manufacturing a surface emitting laser.

As illustrated in FIG. 4C, the openings at a portion in the groove 13 and at a portion on the mesa 19 of the insulating film are formed. The electrode 40 is provided on the contact layer 27, and the electrode 42 is provided on the contact layer 14 by, for example, resist patterning and vacuum evaporation. The insulating film 30 is formed on the electrodes 40 and 42, e.g., by plasma CVD. Openings in the insulating film 30 are formed at portions overlapping the electrode 40 and 42.

The wirings 41 and 43 and the pads 44 and 46 are formed, for example, by plating treatment, on the insulating film 30. The wiring 41 and the pad 44 are electrically connected to the electrode 40, and the wiring 43 and the pad 46 are electrically connected to the electrode 42. By dividing the substrate at the trench 11, a chip-shaped surface emitting laser 100 is formed.

According to the first embodiment, the connecting portion 45 connects between the mesa 19 and the terrace 17, and the wiring 41 is provided over the connecting portion 45. Therefore, as compared with a case of providing the wiring 41 in the groove 13, the distance between the wiring 41 and the conductive semiconductors included in the DBR layers 16 and 20 is increased. Therefore, it is possible to reduce the parasitic capacitance, and the operation at a high frequency of the surface emitting laser 100 becomes good.

The connecting portion 45 is inclined from the [011] direction and the [01-1] direction. As a result, the oxidation speed of the DBR layer 20 can be controlled to form the aperture 21b having a desired shape. Since a smooth curve is formed in an outer edge of the aperture 21b and no protrusion is formed, a concentration of current is suppressed and a breakage is hardly caused.

Specifically, the inclination angle from the [011] direction and [01-1] direction of the connecting portion 45 is set to be 35° or more, and 55° or less, and preferably be 45°. Thus the connecting portion 45 extends along the [010] direction. The connecting portion 45 is inclined from the [011] and [01-1] directions in which the oxidation speed is small, the connecting portion 45 covers the side surface of the mesa 19 at the [010] direction in which the oxidation speed is large. Thus, the oxidation speed of the DBR layer 20 can be controlled, for example, to be equivalent. As a result, the aperture 21b having the desired shape can be formed.

In addition to the [010] direction, the connecting portion 45 may be connected to the mesa 19 from [0-10] direction, [001] direction, or [00-1] direction. In other words, the connecting portion 45 is preferably inclined from <011> direction, and it is preferable to connect the connecting portion 45 to the mesa 19 from the <001> direction.

The current is injected into the surface emitting laser 100 through the pad 44, the wiring 41 and the electrode 40. To increase the intensity of the light emitted from the laser, a large amount of the current may be injected. On the other hand, when the large amount of current flows in the wiring 41, a heat generation from the wiring 41 increases. Further, when the wiring 41 is thin, an electrical resistance is increased resulting in an additional heat generation. As illustrated in FIG. 1, by providing the wiring 41 to each of the two connecting portions 45, it is possible to increase a total width of the two wirings 41 than the one wiring 41. Therefore the electrical resistance is reduced by providing the two wirings 41, and it is possible to suppress the heat generation of the wiring 41.

The width W1 of the one wiring 41 is, for example, 5 μm or more, and a sum of the two widths is, for example, 10 μm or more. As a result, the heat generation can be more effectively suppressed. The number of wirings 41 and the number of connecting portions 45 may be two or more.

In order to branch the wiring 41 and the connecting portion 45 as described above in a plurality, the groove 15 is provided between the connecting portions 45. When the width W2 of the groove 15 is small, the dry-etching to form the groove 15 becomes difficult. When the width W2 is large, the connecting portions 45 approach the [011] direction or the [01-1] direction. Therefore, the width W2 of the groove 15 is, for example, 3 μm or more and 20 μm or less. As a result, two connecting portions 45 can be formed by etching, and the connecting portion 45 can be arranged apart from the [011] direction and the [01-1] direction so as to be arranged near the [010] direction.

The substrate 10 is formed of GaAs, and the DBR layers 16 and 20 are formed of AlGaAs. The DBR layers and other semiconductor layers are laminated on the (100) plane of the substrate 10. The DBR layer 20 is hardly oxidized in the [011] direction and the [01-1] direction, and is easily oxidized in the [010] direction. By providing the connecting portions 45 in a direction in which the oxidation is easily performed, the aperture 21*b* having a desired shape can be formed. The substrate 10, the DBR layers 16 and 20, and the active layer 18 may be formed of a compound semiconductor different from that of the first embodiment.

What is claimed is:

1. A method for manufacturing a surface emitting laser comprising steps of:
    forming a lower reflector layer, an active layer, and an upper reflector layer on a substrate in order;
    forming a high-resistance region by implanting ions into a portion of the lower reflector layer, the active layer, and the upper reflector layer;
    forming a mesa, a terrace, and a connecting portion from the lower reflector layer, the active layer, and the upper reflector layer;
    forming a current confinement structure in the mesa; and
    forming a wiring on each of a top surface of the terrace, the connecting portion, and the mesa,
    wherein the terrace and the connecting portion include the high-resistance region,
    a first groove is provided between the mesa and the terrace,
    the connecting portion connects the terrace and the mesa,
    the connecting portion extends in a direction inclined from <011> direction of the substrate, and
    the step of forming the current confinement structure includes a step of oxidizing a part of the upper reflector layer from a side surface of the mesa so as to form an aperture surrounded by an oxide region.

2. The method for manufacturing a surface emitting laser according to claim 1, wherein the connecting portion has an inclination angle from the <011> direction of the substrate in a range of 35° or more and 55° or less.

3. The method for manufacturing a surface emitting laser according to claim 1, wherein a plurality of connecting portions connect the mesa and the terrace,
    a second groove is formed between the plurality of connecting portions, and
    a plurality of wirings are provided on each of the plurality of connecting portions.

4. The method for manufacturing a surface emitting laser according to claim 3, wherein each of the plurality of wirings has a width of 5 μm or more.

5. The method for manufacturing a surface emitting laser according to claim 3, wherein the second groove has a width of 3 μm or more and 20 μm or less.

6. The method for manufacturing a surface emitting laser according to claim 1, wherein the substrate is formed of gallium arsenide,
    the lower reflector layer and the upper reflector layer are formed of aluminum gallium arsenide, and
    the current confinement structure includes aluminum oxide.

\* \* \* \* \*